Oct. 27, 1970 S. KNIGHT ET AL 3,535,772

SEMICONDUCTOR DEVICE FABRICATION PROCESSES

Filed March 25, 1968 2 Sheets-Sheet 1

INVENTORS: S. KNIGHT
T. J. RILEY

BY Roderick B. Anderson
ATTORNEY

SEMICONDUCTOR DEVICE FABRICATION PROCESSES

Filed March 25, 1968 2 Sheets-Sheet 2

United States Patent Office 3,535,772

Patented Oct. 27, 1970

3,535,772

SEMICONDUCTOR DEVICE FABRICATION PROCESSES

Stephen Knight, New Providence, and Terence J. Riley, Plainfield, N.J., assignors to Bell Telephone Laboratories, Incorporated, Murray Hill, N.J., a corporation of New York Filed Mar. 25, 1968, Ser. No. 715,902
Int. Cl. H01l 7/02, 7/10, 7/24
U.S. Cl. 29—578 12 Claims

ABSTRACT OF THE DISCLOSURE

A bulk-effect device is made by growing an epitaxial active layer on a semi-insulating substrate, forming ohmic contacts near opposite ends of the active layer, reducing the substrate thickness and bonding heat-sinking blocks to opposite sides of the device. The ohmic contacts are made by etching the active layer and regrowing high conductivity semiconductor regions in a single step.

BACKGROUND OF THE INVENTION

The structure and operation of bulk-effect devices, known also as two-valley devices and as Gunn-effect devices, are described in detail in a series of papers in the January, 1966 issue of the IEEE Transactions on Electron Devices, vol. ED–13, No. 1. As is set forth in these papers high frequency oscillations can be generated by applying a suitable electric field across a bulk semiconductor sample of substantially uniform constituency having two energy band "valleys" within the conduction band which are separated by only a small energy difference.

The best material found thus far for bulk-effect semiconductor diodes is n-type gallium arsenide. Although devices have been made using wafers cut from larger crystals of gallium arsenide, such wafers often do not have the homogeneous constituency and freedom from crystalline defects required for optimum operation. More dependably uniform n-type gallium arsenide layers to be used as active device regions can be made by epitaxial growth on a gallium arsenide substrate having a different conductivity. Epitaxial growth refers to a process of deposition of one material onto a crystalline substrate such that the deposited material forms a crystal which constitutes, in effect, an extension of the crystalline lattice structure of the substrate.

The copending application of Knight et al., Ser. No. 673,139, filed Oct. 5, 1967 and assigned to Bell Telephone Laboratories, Incorporated, describes a process for making bulk-effect diodes comprising the steps of epitaxially growing an n-conductivity layer on a substrate of $n^+$ conductivity gallium arsenide, growing an $n^+$ layer over the n layer, applyng a metal contact to the $n^+$ layer, reducing the thickness of the substrate, and applying a metal contact to the substrate to form the diode. As is well known, the $n^+$ conductivity layers between the metal contacts and the active n layer are convenient elements for giving good ohmic contacts. The application points out the desirability of minimizing the thermal impedance between the active n layer and the metal contacts so that heat can be efficiently drained from the active layer.

The application of Klein et al., Ser. No. 556,192, filed June 8, 1966, now abandoned and assigned to Bell Telephone Laboratories, Incorporated, describes a method for epitaxially growing n-type gallium arsenide layers from a liquid charge of tin saturated with gallium arsenide. Both of these techniques result in a finished multilayer structure referred to in the art as a "sandwich structure."

While the epitaxial techniques for producing sandwich structure diodes are satisfactory for many purposes, they are not parctical for making diodes having long active regions, that is, having a large distance between opposite ohmic contacts. On the other hand, many bulk-effect devices that have been proposed require long n-type active regions. For example, the diode described in the copending application of J. A. Copeland III, Ser. No. 564,081, filed July 11, 1966, and assigned to the Bell Telephone Laboratories, Incorporated, describes a diode oscillator, now known in the art as the LSA oscillator, in which it is desirable to use a long active region for increasing the generated output power. Also, numerous other bulk-effect devices to be used for such purposes as wave shaping, pulse regeneration and various logic functions, have been proposed which likewise require relatively long active regions.

SUMMARY OF THE INVENTION

One method considered by us for making bulk-effect diodes having long active regions was to grow an epitaxial layer on an insulating substrate and then apply stripe-shaped ohmic contacts on the top surface of the layer. Unlike the sandwich structure described above, the length of the active region would then be taken as the length of the upper surface of the layer between ohmic contacts, rather than the thicknes of the layer, and heat could be drained from the substrate along the entire active region length. While this makes possible an extremely long active region of continuous epitaxial n-type gallium arsenide, it does not work very well in practice because of unavoidable nonuniformities of the electric field extending through the device between opposite ohmic contacts during operation.

We have found, however, that dependable bulk-effect devices have good operating characteristics may be made by the following techniques in accordance with an illustrative embodiment of the invention. An n-type layer of gallium arsenide is epitaxially grown on a substrate of semi-insulating gallium arsenide, that is, gallium arsenide having a carrier concentration that is so low that it acts substantially as an insulator. The epitaxial layer is coated with a mask material having windows separated by distance equal to the desired length of the active region of the device. The masked epitaxial layer is then covered with a molten charge of tin which has been previously saturated with gallium arsenide.

Next, the temperature of the substrate is raised to a second temperature at which the molten charge is capable of dissolving a predeterimned additional quantity of gallium arsenide. At this second temperature, the epitaxial regions which are exposed to the molten tin dissolve into the tin until the tin again becomes saturated at the second temperature. The temperature of the substrate is then lowered approxiamtely to the first temperature at which the tin charge was initially sautrated. This causes gallium arsenide in the molten tin to be epitaxially deposited back onto the epitaxal layer, but included within the newly formed epitaxial crystalline structures are atoms of tin which give it the $n^+$ conductivity required for defining ohmic contacts.

After the remaining molten tin charge has been removed from the wafer, leads are bonded onto the exposed $n^+$ layers which eventually become leads of a finished bulk-effect diode. A relatively massive beryllia block is bonded to opposite leads and the intervening active region. Next, the substrate is reduced in thickness and, if a large plurality of diodes have been formed on a single wafer, the wafer is diced to define individual diode elements.

Using the beryllia block to support the diode element, the remaining semi-insulating substrate is removed and a second beryllia block is bonded to the diode opposite the first block. The beryllia blocks are electrically insulative and therefore do not interfere with current between opposite ohmic contacts, but they are highly thermally conductive and act as good heat sinks for the active region during device operation.

The above technique provides bulk-effect diodes each having, at opposite ends of a long epitaxial layer, ohmic contacts which are suitable for producing a uniform electric field throughout the active region. The diode can operate under conditions of high power because of the efficient heat sinking from the active region. Finally, all of the processing steps involved in making the device are practical, expeditious and reasonably inexpensive.

DRAWING

These and other objects, features, and advantages of the invention will be better understood from a consideration of the following description in conjunction with the drawing in which.

DETAILED DESCRIPTION

Figure 1:
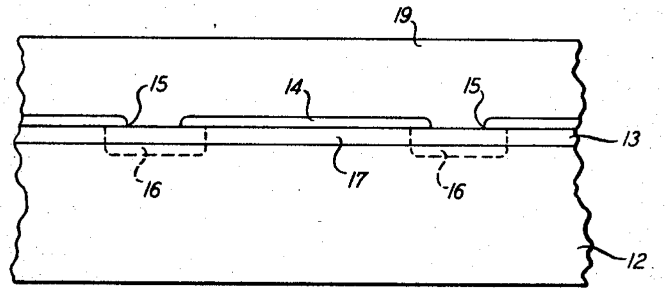
FIG. 1 is a schematic illustration of a partially fabricated semiconductor structure which is made in accordance with an illustrative embodiment of the invention.

Referring now to FIG. 1, there is shown a portion of a gallium arsenide wafer 12 which is used as a substrate in the fabrication of bulk-effect diodes in accordance with an illustrative embodiment of the invention. The wafer substrate 12 is preferably semi-insulating gallium arsenide, that is, it has a carrier concentration of typically less than $10^8$ carriers per cubic centimeter. The first step in fabricating bulk-effect diodes is to epitaxially grow in a known manner a layer 13 of n-type gallium arsenide on an upper surface of the wafer. The n-type layer 13 may typically have a carrier concentration of $10^{13}$ to $10^{16}$ $cm.^{-3}$ and a thickness of 3 to 75 microns. A thin layer 14 of mask material such as silicon dioxide is deposited on the upper surface of the epitaxial layer with stripe-shaped windows 15 being subsequently etched in the mask layer. The mask layer 14 is deposited by any of a number of well-known techniques with the windows 15 preferably being defined by a known photolithography process which permits selective etching to expose only desired portions of the epitaxial layer. It is intended that the epitaxial layer between adjacent windows 15 will eventually constitute the active region of a bulk-effect diode and the purpose of the windows is to define regions in which ohmic contacts to opposite sides of the active region can be made. Ohmic contacts are intended to be formed at regions 16 shown by dotted lines with the intervening region 17 of the epitaxial layer eventually constituting the active region of a diode. Only a small portion of the entire wafer to be processed is shown; in most practical embodiments of the invention, numerous diodes are simultaneously fabricated on the surface of a single crystalline wafer.

Figure 2:
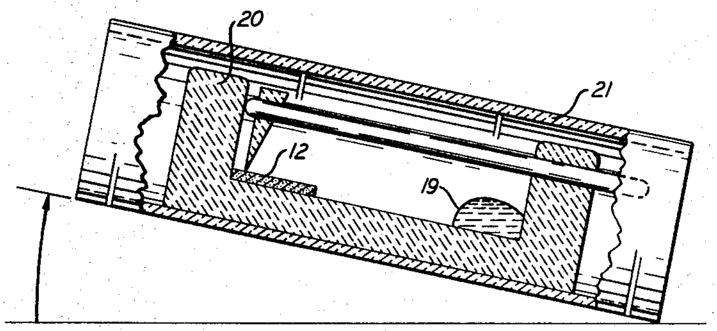
FIG. 2 is a schematic illustration of apparatus used in processing the semiconductor structure of FIG. 1.

The manner in which ohmic contacts, consisting of regions of relatively highly doped $n^+$ gallium arsenide, are formed in region 16 can be understood with reference to FIG. 2 which shows a graphite boat 20 contained within a quartz tube 21 of the type conventionally used in the art for processing semiconductor devices. The boat is tilted to contain at one end a charge 19 of tin to which has been added powdered gallium arsenide. The quantity of gallium arsenide in the charge is sufficient to dissolve into and completely saturate the tin at a first temperature to which the graphite boat is heated. The quartz tube and boat are maintained within a furnace which heats the assembly to the first temperature, typically 600° C., which melts the tin charge 19 and causes the powdered gallium arsenide to dissolve into and saturate the tin. Alternatively, elemental gallium and arsenic can be dissolved into the tin.

Figure 3:
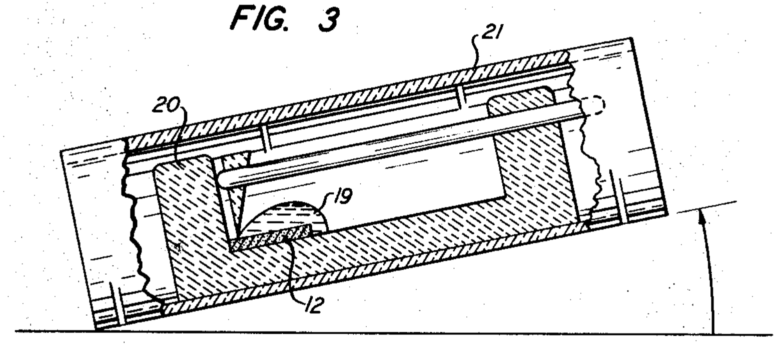
FIG. 3 is a view of the apparatus of FIG. 2 during a subsequent step in the process.

The assembly is then titled as shown in FIG. 3 to cause the molten tin 19 to overlay the wafer as is also shown in FIG. 1. Next, the assembly is heated, typically at a rate of 12° C. per minute, to a higher second temperature at which the tin charge is no longer saturated. As a result, that region of the epitaxial layer of FIG. 1 which is exposed to the molten tin 19 will dissolve into the tin and saturate it at the second temperature. For example, with the assembly heated to 650° C., the region 16 of FIG. 1 may dissolve into the charge 19 to saturate the tin at that temperature.

Thereafter, the assembly is cooled back to the first temperature at a rate of typically 15° C. per minute. This causes the dissolved gallium arsenide in the charge to go out of solution and epitaxially grow in the region 16 of FIG. 1. As the gallium arsenide regrows on the wafer, atoms of tin are inherently dispersed throughout the regrown crystalline structure to give a high carrier concentration, typically on the order of $10^{19}$ carriers per $cm.^3$.

Thus the desired $n^+$ regions are formed as required for giving good ohmic contacts to the active region 17. After the gallium arsenide regrowth, the molten charge 19 is removed from the wafer and the wafer is cleaned of any residue.

Figure 4:
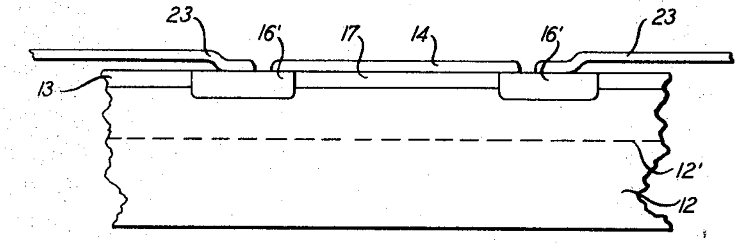
FIGS. 4, 5 and 6 are schematic illustrations of semiconductor structures at various stages of fabrication in accordance with an illustrative embodiment of the invention.

As shown in FIG. 4, thin film conductive contacts 23 are applied to the $n^+$ regions 16'. The substrate wafer 12 is then preferably reduced in thickness by lapping or polishing the bottom surface of the substrate to the thickness shown by dotted line 12'. The substrate should not be lapped to so small a thickness that it will not be self-supporting; it may typically be reduced in thickness to approximately 4 mils.

Figure 5:
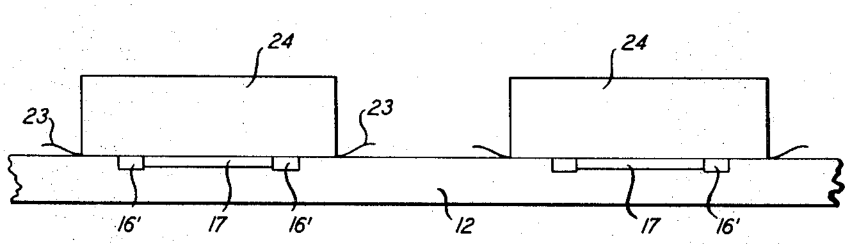

FIG. 5 shows the reduced-thickness wafer 12 on a sufficiently large scale to include two of the active regions 17. After the substrate has been lapped, beryllium oxide blocks 24 are bonded to opposite $n^+$ regions 16' and the intervening active region 17. The substrate 12 is then cut or diced to define individual diode elements. Using the beryllium oxide block 24 of each diode element as a support, the substrate 12 is again reduced in thickness and may be eliminated entirely, leaving only the epitaxial layers 17 and 16'. This may be done in a number of known ways as, for example, etching with Syton and using infrared light to monitor the thickness of the remaining layer.

Figure 6:
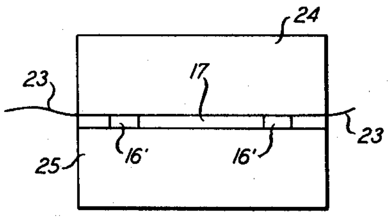

Finally, a second beryllium oxide block 25 is bonded to each diode element opposite the block 24 as shown in FIG. 6 to complete the diode. It can be appreciated that the diode comprises a relatively long epitaxial active region 17 between opposite ohmic contacts 16' which are capable of forming a uniform electric field through the active region. The beryllium oxide blocks 24 and 25 have a low thermal impedance and therefore constitute good heat sinks for draining heat from the active region 17 during device operation; on the other hand, they are electrically insulative and therefore do not interfere with the electrical characteristics of the device.

It can also be appreciated that the goal of constructing bulk effect diodes having the desired mechanical and electrical characteristics described above can be achieved by a process which is straightforward, expedient and reproducible. The etching of regions 16 of FIG. 1 and regrowing therein the $n^+$ regions 16' of FIG. 4 are accomplished in a single step which admits of a high degree of precision. Since the mass of the molten tin charge 19 and the temperature to which the assembly of FIG. 3 is heated are precisely controllable, the mass of the gallium arsenide which is etched out from region 6 of FIG. 1 is readily predictable and controllable. Likewise, when the substrate is cooled, the extent to which the $n^+$ gallium arsenide layer 16' of FIG. 4 is regrown is predictable and controllable. The steps of applying the conductive contacts, reducing the substrate thickness, and bonding the beryllium oxide blocks are, of course, straightforward matters that are well within the ordinary skill of the worker in the art.

The techniques and structures that have been shown are intended only to be illustrative of the inventive concepts involved. While it is most convenient to etch troughs in the wafer and grow the $n^+$ ohmic contacts in a single step, it can be done in two steps, if desired. Beryllium oxide is the preferred material for blocks 24, but others could alternatively be used. For example, a metal block can be thermal-compression bonded to the thin layer of semi-insulating substrate, with the reduced-thickness substrate providing the required electrical insulation. Also the technique can be used with semiconductors other than gallium arsenide and with p-type semiconductors. Various other embodiments and modifications may be made by those skilled in the art without departing from the spirit and scope of the invention.

What is claimed is:

1. The process for making semiconductor devices comprising the steps of:

epitaxially growing a layer of first material on a first surface of a semiconductor wafer substrate;

overlaying the epitaxial layer with a coating of mask material;

etching portions of the mask material to expose selected regions of the epitaixal layer;

melting a quantity of a second material at a first temperature, said first material being soluble in said molten second material;

dissolving to saturation a quantity of said first material into said quantity of second material;

contacting said exposed regions of the epitaxial layer with said saturated quantity of second material;

heating said wafer to a second temperature which is above said first temperature;

said second temperature being sufficiently high to cause dissolution of substantially all of the exposed regions of the epitaxial layer into the second material; and cooling said wafer to a third temperature which is lower than said second temperature, thereby forming along the epitaxial layer relatively high impurity regions having therein a distribution of atoms of the second material.

2. The process of claim 1 further comprising the steps of:

bonding leads to each high impurity region;

bonding first blocks of high thermal conductivity and low electrical conductivity to adjacent high impurity regions and the intervening layer surface;

cutting the wafer substrate to define individual elements;

removing a major part of the substrate of each diode element; and bonding a second block of high thermal conductivity to each element opposite the first block.

3. The process of claim 1 wherein:

the first material is gallium arsenide;

the second material is tin:

the first and third temperatures are approximately 600° C.;

the second temperature is approximately 650° C.

4. The process of claim 2 wherein:

the substrate is of susbtantially semi-insulating or insulating conductivity; and the second block is made of metal.

5. The process of claim 2 wherein:

the first and second blocks are made of beryllium oxide.

6. The process for making semiconductive devices comprising the steps of:

growing an epitaxial layer of a first conductivity on a first surface of a flat substrate of crystalline semiconductive material;

etching troughs through substantially the entire epitaxial layer;

growing high conductiivty layers in the troughs;

bonding contacts to opposite high conductivity layers;

bonding first heat-sink blocks to adjacent layers and the intervening first conductivity epitaxial layer;

cutting the substrate into individual elements;

reducing the thickness of the substrate of each element; and bonding a second heat-sink block to each element opposite the first heat-sink block.

7. The process of claim 6 wherein:

the step of etching the troughs and growing the high conductivity layers comprise the steps of:

dissolving to saturation a quantity of semiconductive material in a quantity of molten impurity material, overlaying selected regions of the epitaxial layer with the saturated impurity material, heating the epitaxial layer to a sufficient temperature to cause dissolution of part of the epitaxial layer into the molten impurity material, and cooling the epitaxial layer to a temperature sufficient to epitaxially grow doped semiconductor layers from the molten mixture.

8. A process for epitaxially growing on a crystalline semiconductor member a layer of the same semiconductor material but having a prescribed concentration of an impurity material that differs from that of the member comprising the steps of:

melting a quantity of the impurity material to form a liquid charge;

dissolving to saturation a quatity of said semiconductor material into said liquid charge at a first temperature;

contacting at least part of one surface of the crystalline member with said saturated liquid charge;

heating said member to a second temperature which is higher than said first temperature and which is sufficiently high to cause dissolution of a substantial part of said crystalline member into the liquid charge;

cooling said member to a third temperature which is cooler than said second temperature, thereby forming along the contacted surface of the member an epitaxial semiconductor layer having therein a substantial distribution of atoms of the impurity material; and removing the remaining liquid charge.

9. The process of claim 8 wherein:

the semiconductor layer and the crystalline substrate are gallium arsenide; and the impurity material is tin.

10. The process of claim 8 wherein:

the first and third temperatures are approximately 600° C.; and the second temperature is approximately 650° C.

11. The process of claim 8 further comprising the step of:

forming a mask over the member which exposes only part of the member surface; and contacting the mask and exposed surface with the liquid charge, whereby a selected region of the crystalline member surface contains an epitaxial layer having a substatnial impurity concentration.

12. The process for making semiconductor devices comprising the steps of forming a crystalline member of a first semiconductor material, melting a quantity of a second impurity material at a first temperature, dissolving to saturation at the fisrt temperature a quantity of said fisrt material into said quantity of said second material, and overlaying the member with said saturated quantity of said second material, wherein the improvement comprises:

heating the member to a second temperature which is above the first temperature after it has been overlayed with the saturated quantity of second material;

the second temperature being sufficiently high to cause dissolution of a substantial part of the semiconductor member into the molten second material;

cooling the substrate to a third temperature which is lower than the second temperature, thereby forming along the substrate a relatively high impurity region having therein a distribution of atoms of the second material; and removing the excess molten second material.

References Cited

UNITED STATES PATENTS

| | | | |
|---|---|---|---|
| 3,270,399 | 9/1966 | Ohntrup | 29—589 X |
| 3,423,255 | 1/1969 | Joyce | 148—171 |
| 3,436,666 | 4/1969 | Claytor et al. | 317—235 |

PAUL M. COHEN, Primary Examiner

U.S. Cl. X.R.

29—589, 591; 148—1.5, 171; 156—17; 317—234